(12) United States Patent  
Imai

(10) Patent No.: US 6,590,437 B2
(45) Date of Patent: Jul. 8, 2003

(54) LOGARITHMIC AMPLIFIER

(75) Inventor: Katsumi Imai, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/061,993

(22) Filed: Feb. 1, 2002

(65) Prior Publication Data

US 2002/0101275 A1 Aug. 1, 2002

(51) Int. Cl.[7] .............................................. G06F 7/556
(52) U.S. Cl. .................................... 327/350; 327/74
(58) Field of Search ............................... 327/350–353, 327/356, 359–361, 74

(56) References Cited

U.S. PATENT DOCUMENTS 4,990,803 A * 2/1991 Gilbert ........................ 327/351
6,104,226 A * 8/2000 Weber ........................ 327/359

* cited by examiner

Primary Examiner—Terry D. Cunningham
Assistant Examiner—Long Nguyen
(74) Attorney, Agent, or Firm—Fish & Richardson P.C.

(57) ABSTRACT

Plurality of linear amplifiers A1, A2, and A3, input signal is applied to these linear amplifiers A1, A2, and A3 and is applied to a comparator 30 carrying out level detection, and only any one of the linear amplifiers is switched to operate corresponding to input signal level.

9 Claims, 7 Drawing Sheets

LOGARITHMIC AMPLIFIER

BACKGROUND OF THE INVENTION

1. Field of the Invention

The present invention relates to a logarithmic amplifier. The logarithmic amplifier is a circuit outputting input signal compressing to logarithm, and is used for various analog electronic circuits. The invention relates particularly to a logarithmic amplifier removing dependency on temperature.

2. Description of the Related Art

A conventional logarithmic amplifier is known, which uses matter that forward direction voltage Vf and forward direction current If of a diode are in logarithmic relation. A circuit diagram of the conventional logarithmic amplifier is shown in FIG. 9. In FIG. 9, input voltage Vi is supplied to an inversion input terminal "−" of an operational amplifier 100 through a resistor R, and a non-inversion terminal "+" is connected to ground. A diode 101 is taken in negative feedback loop of the operational amplifier 100. Forward direction voltage Vf and forward direction current If of the diode 101 are in the following logarithmic relation.

$$Vf = K \times \log(Tf/Is) \quad (1)$$

Here, constant K is a constant determined by Boltzmamm's constant k, absolute temperature T, electric charge of electron Q, and so on. "Is" is saturation current when backward direction voltage is applied to the diode 101.

Since the inversion input terminal "−" of an operational amplifier 100 is imaginary earth, the following expression holds letting Ii is current flowing through the resistor R.

$$Ii = Vi/R = If \quad (2)$$

$$Vo = -Vf \quad (3)$$

The following expression (4) is deduced from the above expressions (1) to (3). That is, output voltage Vo converting input voltage Vi to logarithm is obtained.

$$Vo = -K \times \log(If/Is) = -K \times \log(Vi/Is \times R) \quad (4)$$

According to the logarithmic amplifier having the above-mentioned constitution, linear characteristics is obtained input voltage Vi in logarithmic scale for horizontal axis, and output voltage Vo for vertical axis as shown in FIG. 10.

However, because constant K has large dependency on temperature in expression (4), there is a problem that sensitivity of output voltage Vo drifts largely by temperature as shown in FIG. 10.

SUMMARY OF THE INVENTION

Then, an object of the invention is to provide a logarithmic amplifier removing dependency on temperature as far as possible and realizing stable operation.

The logarithmic amplifier of the invention provides: a plurality of linear amplifiers, to each of which input signal is supplied, having different gains; and a comparator detecting a plurality of different levels of said input signal and outputting level detecting signal corresponding to the individual level, wherein any one of the linear amplifiers among said plurality of linear amplifiers is switched so as to operate by supplying said level detecting signal to said plurality of linear amplifiers.

Because the linear amplifier is small in dependency on temperature, by switching so that any one of linear amplifiers among the a plurality of linear amplifiers operates corresponding to level of input signal, logarithmic converting characteristics of the logarithmic amplifier are obtained approximately and the logarithmic amplifier removing dependency on temperature as far as possible can be obtained. By increasing number of linear amplifiers and levels of input signal detected by the comparator, it is possible to improve logarithmic characteristics.

DESCRIPTION OF THE PREFERRED EMBODIMENTS

Figure 1:
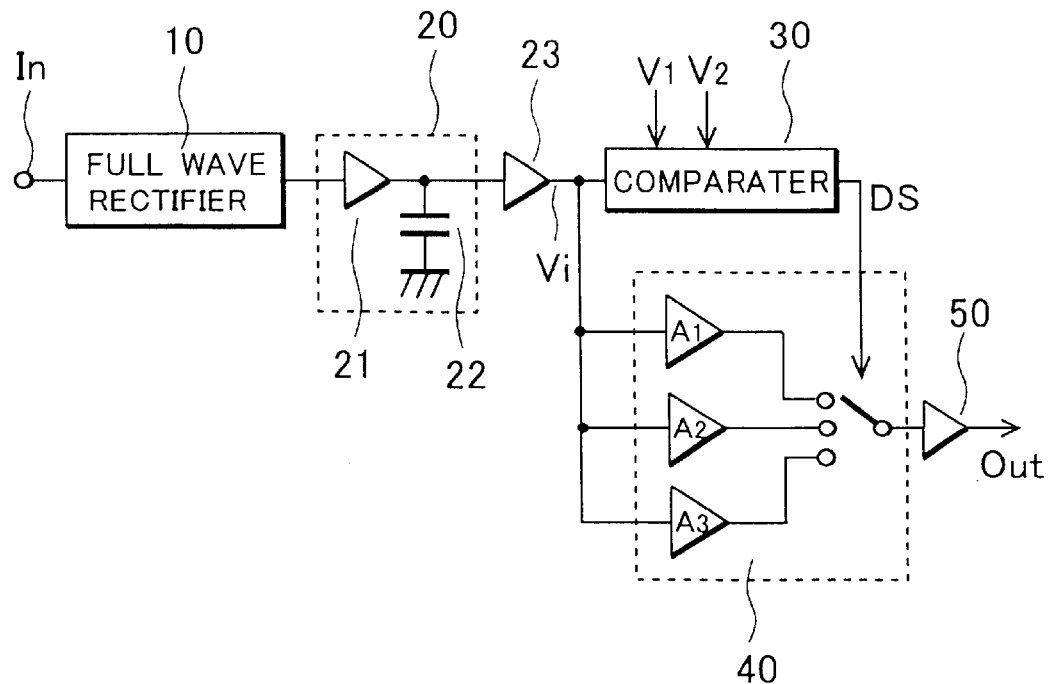
FIG. 1 is as an outline of a circuit block diagram showing a logarithmic amplifier according to the mode for carrying out the invention.

A mode for carrying out the invention will be described referring FIG. 1 to FIG. 8. FIG. 1 is an outline of a circuit diagram to describe a logarithmic amplifier according to an embodiment of the invention. Although the logarithmic amplifier is applied for various analog circuits, for example, it is used for making control signal to carry out automatic tracking at playing back audio signal recorded in video tape and the like. In this embodiment, a circuit to make the control signal by logarithm-converting DC signal DC-detecting reproduced FM carrier signal (frequency f0=1.3 MHz) as an example.

Referring FIG. 1, reproduced FM carrier signal (AC signal) applied to an input terminal IN is supplied to a full wave rectifier 10 to carry out full-wave rectification. The output of the full wave rectifier 10 is fed to a DC detector 20 to carry out DC detection. The DC detector 20 consists of a buffer 21 and a smoothing capacitor 22.

Figure 2A:
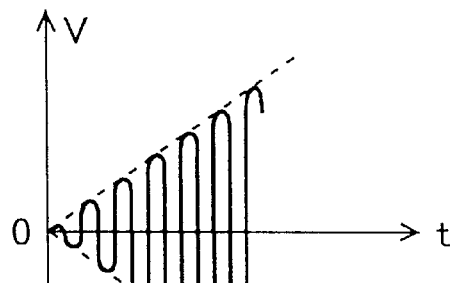
FIGS. 2A through 2C are views showing signal waveform of input stage of the logarithmic amplifier according to the mode for carrying out the invention.
Figure 2B:
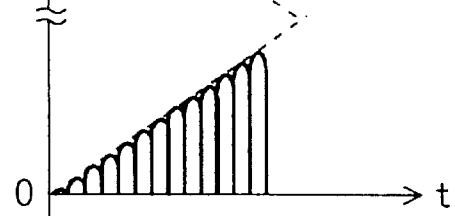
Figure 2C:
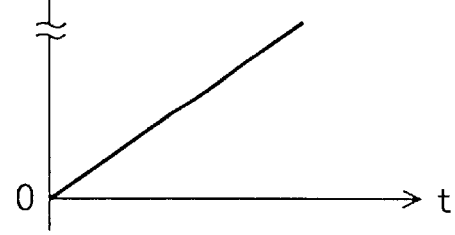

FIGS. 2A through 2C are views showing signal waveform of input stage of the logarithmic amplifier, input regenerative FM carrier signal is shown in FIG. 2A, output signal of the full wave rectifier 10 is shown in FIG. 2B, and output signal of the DC detector 20 is shown in FIG. 2C.

The reproduced FM carrier signal Vi converted to DC voltage signal by the DC detector 20 is further supplied to each input terminal of linear amplifiers A1, A2, and A3 of a comparator 30 and a linear amplifier group 40 through a buffer 23.

Here, linear amplifiers A1, A2, and A3 have different gains. Letting G1 be a gain for the linear amplifier A1, G2 a gain for the linear amplifier A2, and G3 a gain for the linear amplifier A3, relation thereof is "G1>G2>G3". In order to constitute the logarithmic amplifier approximately, gain values are set to the followings in the circuit for example: G1=10, G2=½, and G3=1/10. Here, although the linear amplifier A1 functions literally as an amplifier, the linear amplifiers A2 and A3 function substantially as attenuators because gains thereof are smaller than 1.

The comparator 30 compares output level Vi (reproduced FM carrier signal converted to DC voltage signal) of the DC detector and reference voltages V1 and V2, and outputs level detecting signal DS corresponding to three comparing results: Vi<V1, V1<Vi<V2, and Vi>V2.

The level-detecting signal DS is supplied to the linear amplifier group. Thus, the linear amplifier group is switched so that the linear amplifier A1 is selected in the case of "Vi<V1", the linear amplifier A2 is selected in the case of "Vi<Vi<V2", and the linear amplifier A3 is selected in the case of "Vi>V2". Output of each of linear amplifiers A1, A2, and A3 switched corresponding to output level Vi of the DC detector 20 in the above way is output through a buffer 50.

Figure 3A:
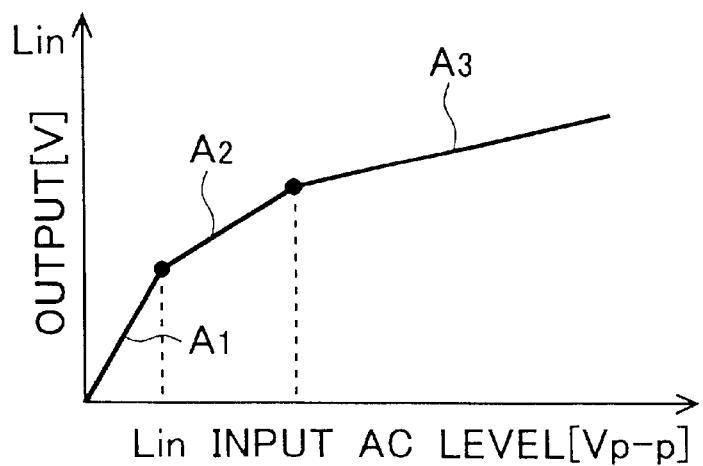
FIGS. 3A and 3B are views showing input-output characteristics of the logarithmic amplifier according to the mode for carrying out the invention.
Figure 3B:
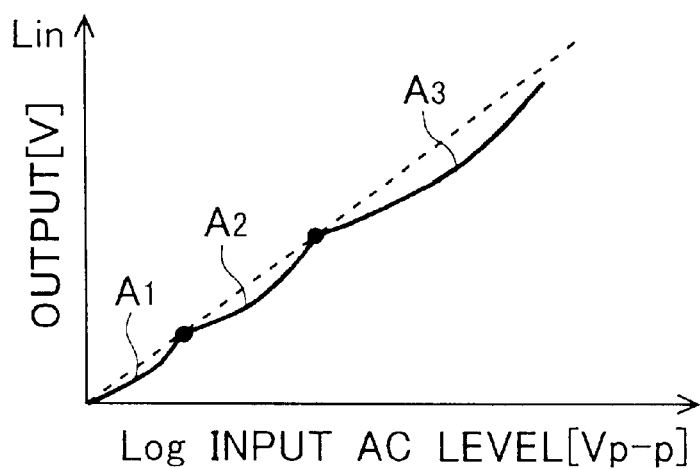

Input-output characteristic charts of the above-mentioned logarithmic amplifier having the above-mentioned constitution are shown in FIGS. 3A and 3B. Since the linear amplifier A1 operates at voltage range of "Vi<V1", the linear amplifier A2 operates at voltage range of "V1<Vi<V2", and the linear amplifier A3 operates at voltage range of "Vi>V2" as shown in FIG. 3A, the linear amplifiers are switched so that gain is made smaller as input signal level Vi becomes large. Therefore, logarithmic characteristics by line graph approximation are obtained as overall input-output characteristics. FIG. 3B is a view showing with logarithmic scale for horizontal axis, and it is known that characteristics of the logarithmic amplifier according to the invention approximates ideal logarithmic characteristics shown with dotted line. It is possible to approximate further ideal logarithmic characteristics by carrying out finer line graph approximation with increasing numbers of reference voltage levels of the comparator 30 and numbers of the linear amplifiers.

Next, detailed circuit constitution of each above-mentioned circuit block will be described.

Figure 4:
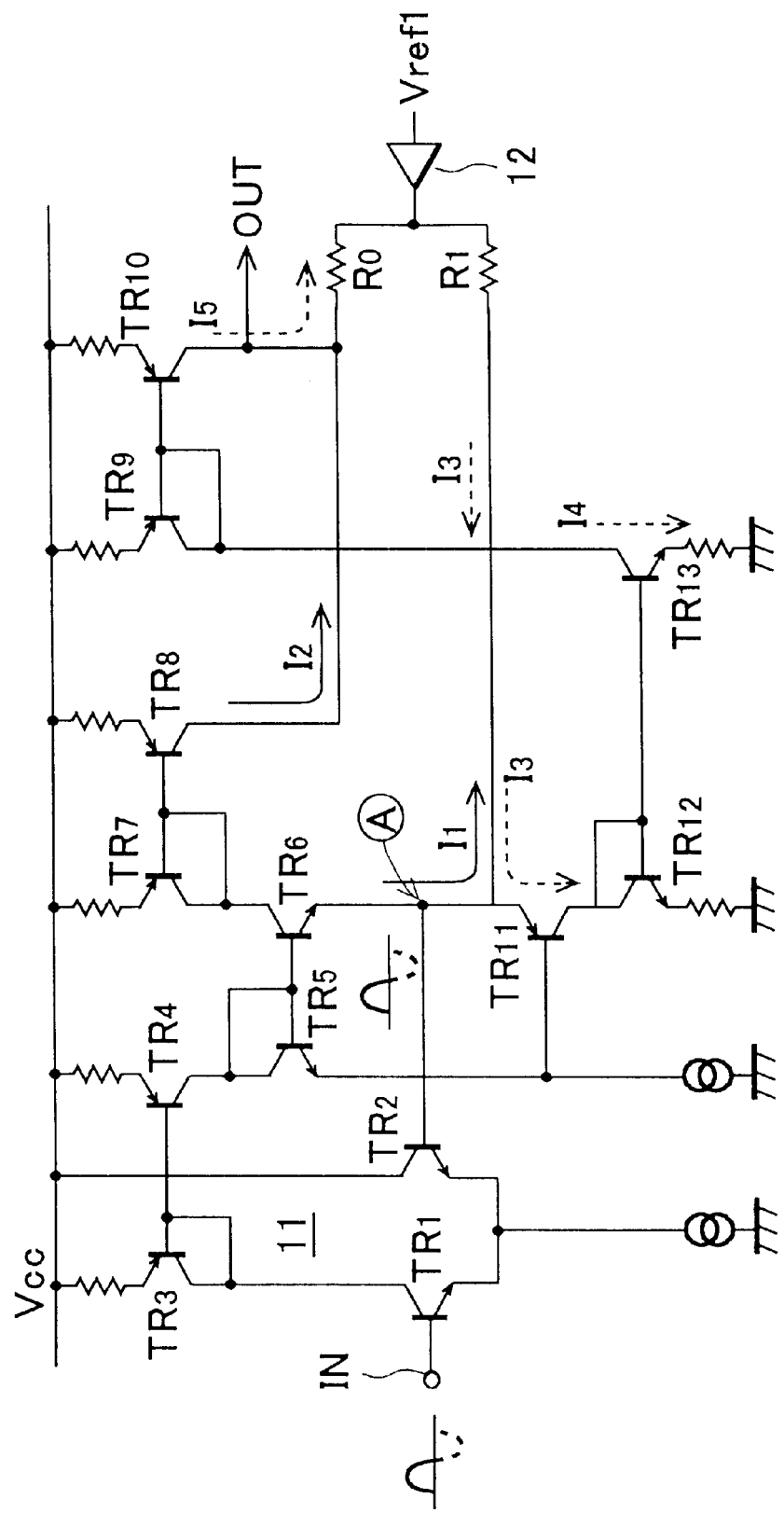
FIG. 4 is a circuit diagram of a full wave rectifier according to the mode for carrying out the invention.

A circuit diagram of the full wave rectifier 10 is shown in FIG. 4. In FIG. 4, NPN type transistors TR1 and TR2 constitute a differential amplifier 11, and input AC signal is applied to base (input terminal IN) of the transistor TR1. A PNP transistor TR3 provided between collector of the transistor TR1 and power source Vcc constitutes a current mirror circuit with a transistor TR4. To output of current mirror circuit, further a current mirror circuit for current polarity inversion consisting of NPN type transistors TR5 and TR6 is provided, and emitter of the transistor TR6 being output of the circuit is connected to base of the transistor TR2.

To base of the transistor TR2, reference voltage Vref1 is applied through the buffer 12 and the resistor R1. Further, to output of a current mirror circuit consisting of PNP type transistors TR7 and TR8 and to output of a current mirror circuit consisting of PNP type transistors TR9 and TR10, reference voltage Vref1 is supplied through the buffer 12 and a resistor R0.

Next, outline of operation of the full wave rectifier 10 having the above-mentioned constitution will be described. When input signal AC is applied to the input terminal IN, the same AC signal generates at base of the transistor TR2 ("A" point in the figure). When the AC signal is positive polarity (part of signal shown with solid line), current I1 flows through the resistor R1 from the transistor TR6. On the other hand, current I2 corresponding to the current I1 flows to the resistor R0 from the current mirror circuit consisting of the transistors TR7 and TR8. Then, by setting "R0>R1," voltage-amplified signal is output from one end of the resistor R0

On the other hand, when the AC signal is negative polarity (part of signal shown with dotted line), current I3 flows to opposite direction of the current I1. The current I3 flows to a transistor TR 12. Since NPN type transistors TR12 and TR13 constitute a current mirror circuit, current I4 corresponding to the current I3 flows through the transistor TR13. Then, current I5 corresponding to the current I4 flows through the resistor R0 from the current mirror circuit consisting of the transistors TR9 and TR10. The voltage-amplified signal of the same polarity is output from collector of the transistor TR10. Therefore, the full wave rectifier 10 rectifies both of positive and negative signal components of the input AC signal, and voltage-amplifies to output.

Figure 5:
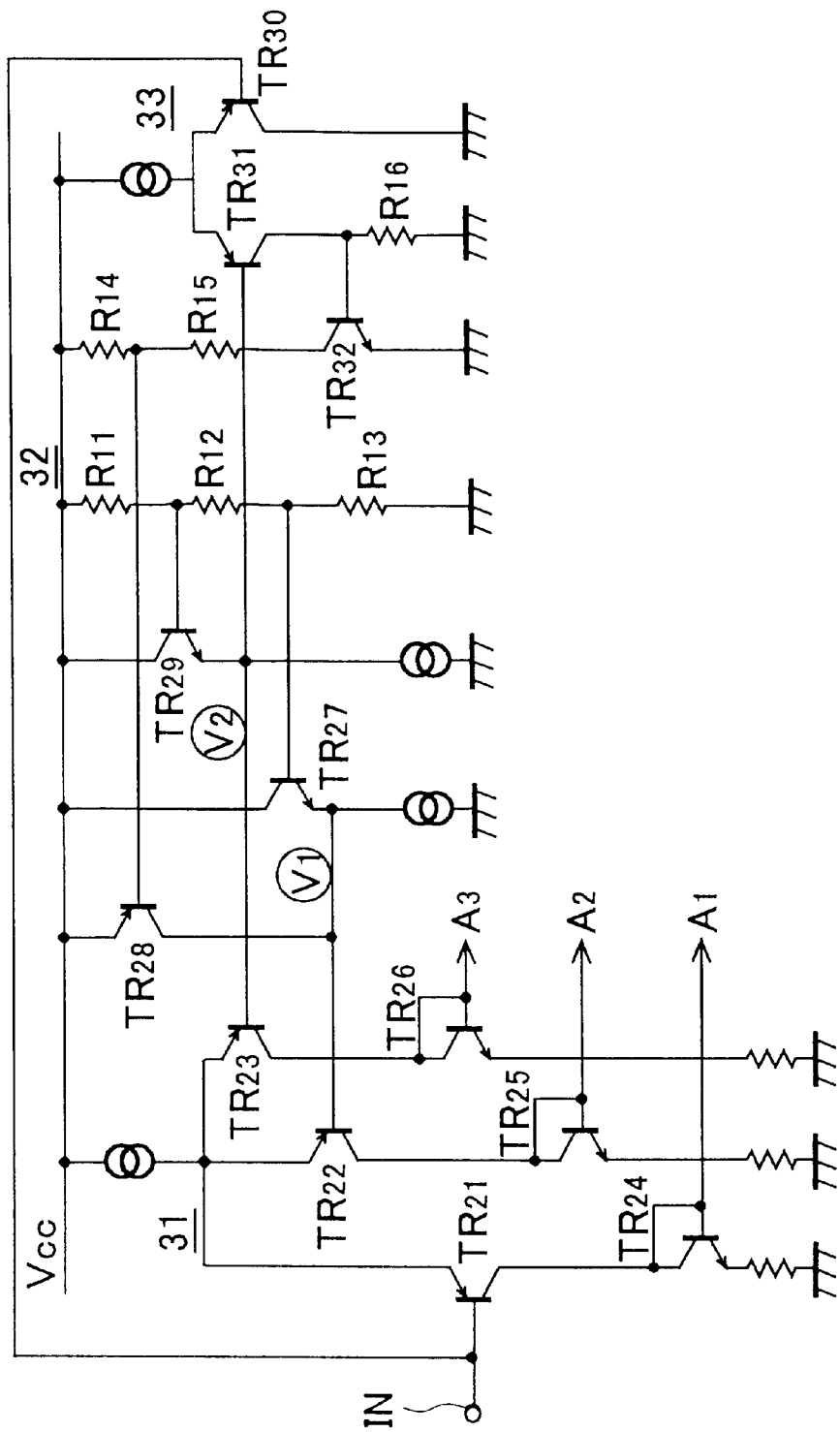
FIG. 5 is a circuit diagram of a comparator according to the mode for carrying out the invention.

A constitution of the comparator 30 will be described referring FIG. 5. PNP type transistors TR21, TR22, and TR23 constitute a differential amplifier 31. Input signal (output Vi of the DC detector 20 in the case of this embodiment) is supplied to base of the transistor TR21.

A resistance string consisting of resistors R11, R12, and R13 connected between power source Vcc and ground generates reference voltage levels V1 and V2 (V1<V2). Reference voltage level V1 is supplied to base of the transistor TR22 through a transistor TR27 from emitter thereof. Reference voltage level V2 is supplied to base of the transistor TR23 through a transistor TR29 from emitter thereof. However, voltages between base and emitter Vbe of transistors TR27 and TR29 are ignored for simplifying.

A PNP type transistor TR28 is provided between the transistor TR22 and power source Vcc. On the other hand, a differential amplifier 33 consisting of transistors TR30 and TR31 is provided. To the transistor TR30, input signal is applied, and to base of the transistor TR31, reference voltage level V2 is applied. The differential amplifier 33 is used for making the above-mentioned transistor TR28 ON by detecting that input signal becomes higher than the reference voltage V2 and for making the transistor TR22 OFF by making base voltage of the transistor TR22 rise forcibly. That is, the differential amplifier 33 and the transistor TR28 constitute a level changeable circuit changing level of the transistor TR22 corresponding to level of input signal Vi.

Next, operation of the above-mentioned comparator 30 will be described. Let us assume that only the transistor TR21 turns ON when input signal Vi is lower than the reference level V1. Then, current flows only through the transistor TR21. The current is supplied to current source transistor of the linear amplifier A1 through the transistor TR24 shorted between collector and base. Thus, only the linear amplifier A1 becomes operating state.

Next, in the case of "V1< input signal Vi<V2", the transistor TR21 turns OFF and only the transistor TR22 turns ON, then, current flows only through the transistor TR22. The current is supplied to current source transistor of the linear amplifier A2 through the transistor TR25 shorted between collector and base. Thus, only the linear amplifier A2 becomes operating state.

Next, in the case that input signal Vi further rises and becomes "Vi>V2", although the transistor TR23 turns ON, the transistor TR22 keeps ON state because V1 is supplied to base of the transistor TR22. However, in order to prevent it, OFF state of the transistor TR22 is made by changing level of the transistor TR22 to higher level than V1 by the above-mentioned level changeable circuit.

Further describing the operation in detail, when input signal Vi becomes higher than V2, the transistor TR31 of the differential amplifier 33 turns ON. Then, current flows through a resistor R32 connected to collector of the transistor TR31, and base voltage of a transistor TR32 rises so that the transistor TR32 turns ON. Thus, current flows through the transistor TR32 and a resistor R14 connected between collector of the transistor TR32 and power source Vcc. Since voltage falls at one end of the resistor R14, base potential of the transistor TR28 falls so that the transistor TR28 turns ON. When the transistor TR28 turns ON, the transistor TR22 turns OFF because base voltage of the transistor TR22 rises, so that only the transistor TR23 turns ON.

Therefore, current flows only through the transistor TR23. The current is supplied to the current source transistor of the linear amplifier A3 through the transistor TR26 shorted between collector and base. Thus, only the linear amplifier A3 becomes operation state.

Figure 6:
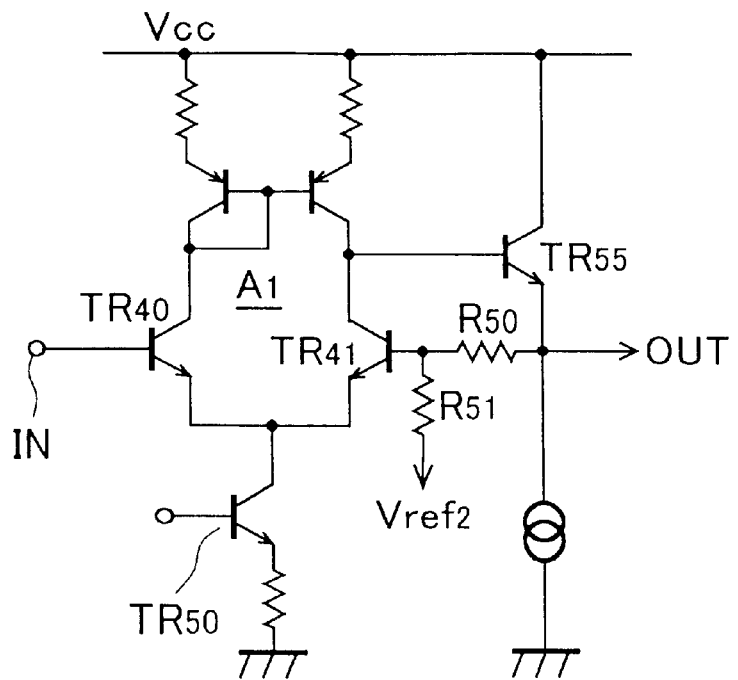
FIG. 6 is a circuit constitution diagram of the linear amplifier according to the mode for carrying the invention.
Figure 7:
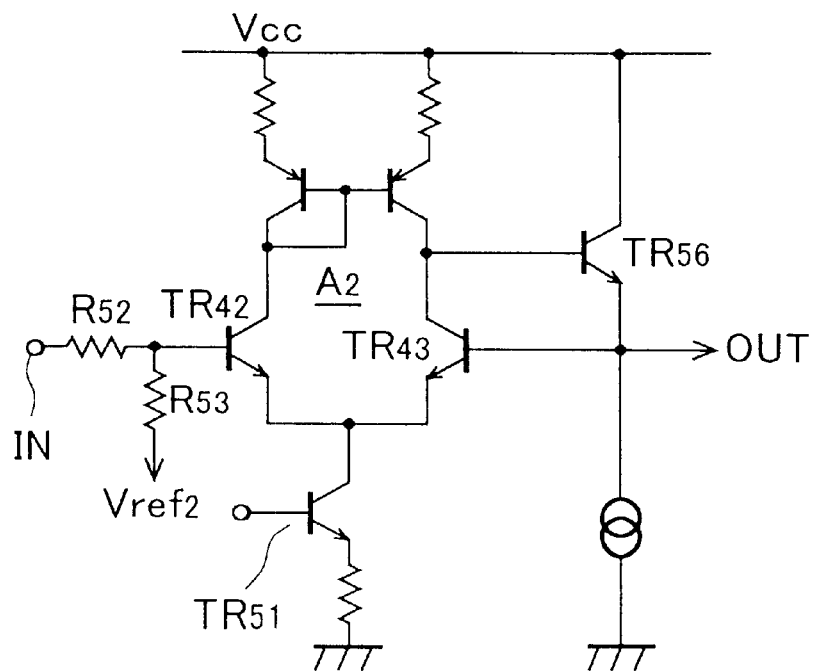
FIG. 7 is a circuit constitution diagram of the linear amplifier according to the mode for carrying the invention.

Next, constitution examples of the linear amplifiers A1, A2, and A3 will be described referring FIG. 6 and FIG. 7. A circuit constitution of the linear amplifier A1 is shown in FIG. 6, and a circuit constitution of the linear amplifier A2 is shown in FIG. 7. The constitution of the linear amplifier A3 is similar with the linear amplifier A2.

In FIG. 6, transistors TR40 and TR41 constitute a pair of differential transistors, and input signal Vi is applied to base of the transistor TR40. Output is taken out from emitter of an output transistor TR55 connecting collector of the transistor TR41 to base of the output transistor TR55. A resistor 50 and a resistor 51 are provided at an output stage. Therefore, gain G1 of the linear amplifier A1 is expressed as the following.

$$G1=(R50+R51)/R51 \quad (5)$$

TR50 is a current source transistor supplying current to the differential transistors TR40 and TR41, to base thereof, level detecting signal DS from the comparator 30 is supplied. Concretely, the transistor TR24 and the current source transistor TR50 constitute a current mirror by that base of the transistor TR24 of the comparator 30 shown in FIG. 5 is connected to base of the current source transistor TR50. That is, corresponding to current from the transistor TR24 of the comparator 30, current is supplied to the current source transistor TR50 so that the linear amplifier A1 becomes state enabling to operate.

In FIG. 7, transistors TR42 and TR43 constitute a pair of differential transistors, and input signal Vi is applied to base of the transistor TR42. Output is taken out from emitter of an output transistor TR56 connecting collector of the transistor TR43 to base of the output transistor TR56. A resistor R52 and a resistor R53 are provided at an input stage. Therefore, gain G2 of the linear amplifier A2 is expressed as the following. Because of "G2<1", the linear amplifier A2 functions as an attenuator.

$$G2=R53/(R52+R53) \quad (5)$$

TR51 is a current source transistor supplying current to the differential transistors TR42 and TR43, to base thereof, level detecting signal DS from the comparator 30 is supplied. Concretely, the transistor TR25 and the current source transistor TR51 constitute a current mirror by that base of the transistor TR25 of the comparator 30 shown in FIG. 5 is connected to base of the current source transistor TR51. Corresponding to current from the transistor TR25 of the comparator 30, current is supplied to the current source transistor TR50 so that the linear amplifier A2 becomes state enabling to operate.

Figure 8:
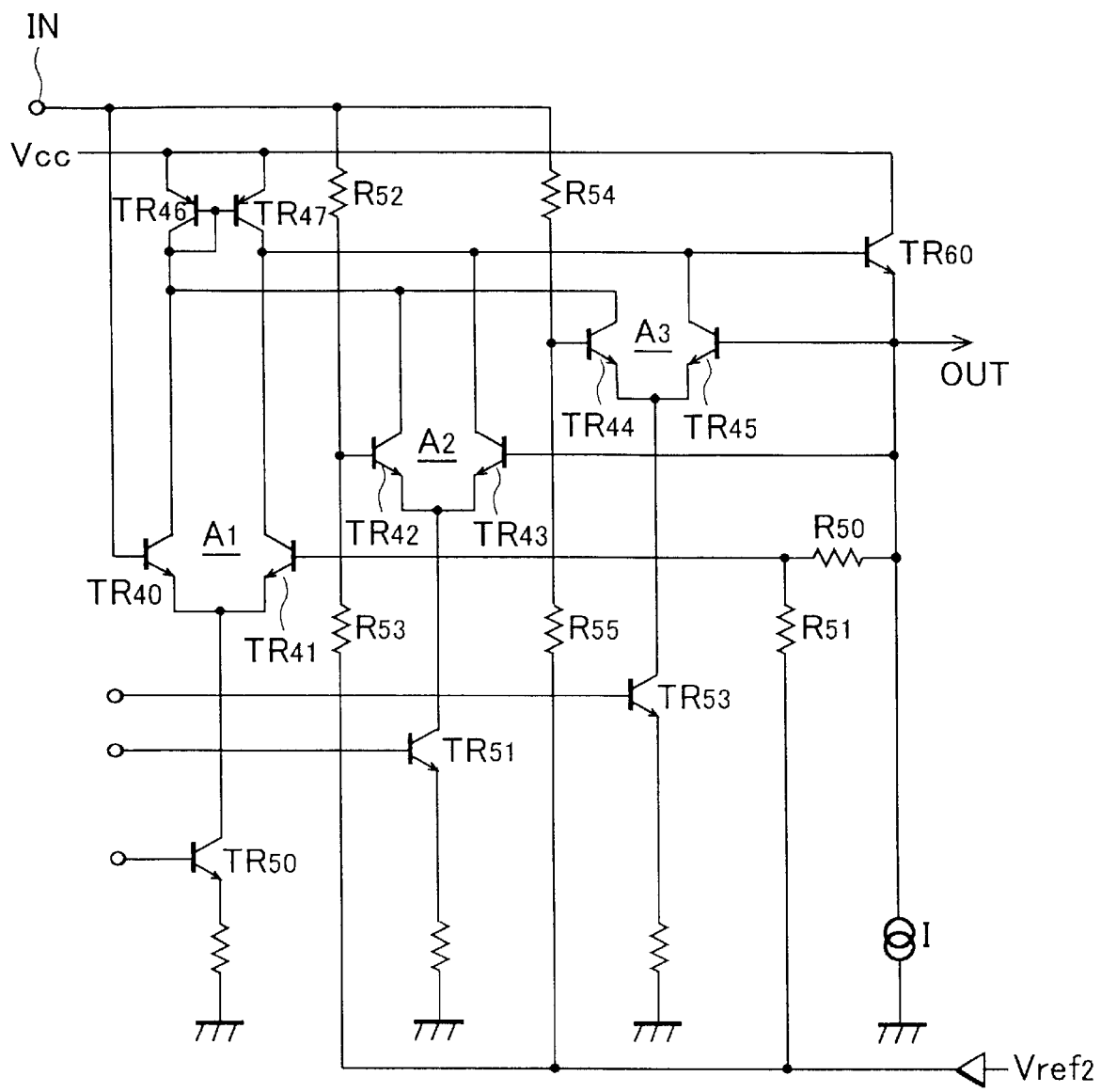
FIG. 8 is a circuit constitution diagram of the linear amplifier according to the mode for carrying the invention.
Figure 9:
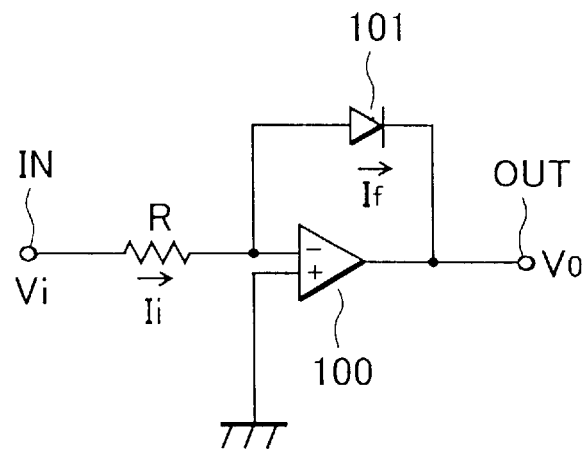
FIG. 9 is a circuit diagram showing the conventional logarithmic amplifier.
Figure 10:
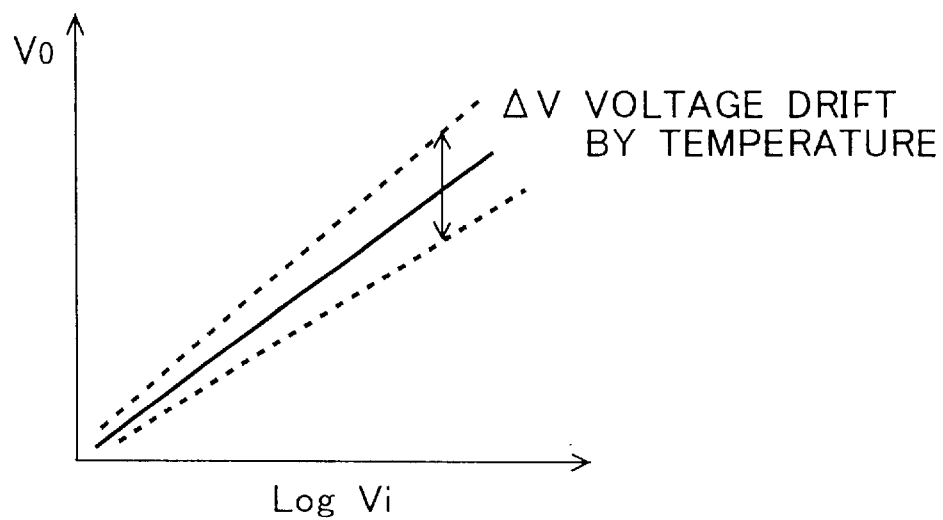
FIG. 10 is a view showing linear characteristics of the conventional-logarithmic amplifier.

Next, another example of circuit constitution of the linear amplifiers A1, A2, and A3 will be described referring FIG. 8. An output transistor TR60 is used for three linear amplifiers A1, A2, and A3 as shown in FIG. 8. Similarly, a current source I connected to emitter of the output transistor TR60 and a current mirror circuit consisting of transistors TR46 and TR47 too are used for the linear amplifiers A1, A2, and A3. Thus, number of circuit elements can be reduced comparing with the case providing individually the linear amplifiers A1, A2, and A3 as shown in FIG. 6 and FIG. 7.

According to the logarithmic amplifier of the invention, since a plurality of linear amplifiers are provided in parallel and any one of linear amplifiers among the a plurality of linear amplifiers is switched so as to operate corresponding to level of input signal, logarithmic converting characteristics are obtained approximately and the logarithmic amplifier removing dependency on temperature as far as possible can be obtained.

What is claimed is:

1. A logarithmic amplifier comprising:
    a circuit having a plurality of linear amplifiers, to each of which input signal is supplied, having different gains; and a comparator detecting a plurality of different levels of said input signal and outputting level detecting signal corresponding to the individual level,
    wherein any one of the linear amplifiers among said plurality of linear amplifiers is switched so as to operate by supplying said level detecting signal to said circuit having plurality of linear amplifiers.

2. A logarithmic amplifier according to claim 1,
    wherein said level detecting signal is supplied to said circuit having plurality of linear amplifiers so as to switch the linear amplifiers step by step to smaller gain linear amplifier as input level becomes larger corresponding to level detecting signal output by said comparator.

3. A logarithmic amplifier according to claim 2,
    wherein said comparator includes: a differential amplifier having an input transistor to base of which input signal is supplied and a plurality of reference transistors to base of which said plurality of different levels are supplied as reference level; and a level changeable means changing level supplied to bases of said reference transistors corresponding to comparing result between said input signal level and said reference level, and
    wherein current flows through any one of transistors among said input transistor and a plurality of reference transistors corresponding to said input signal level, and current signal corresponding to the current becomes level detecting signal.

4. A logarithmic amplifier according to claim 3,
    wherein each of said plurality of linear amplifiers include: a pair of differential transistors to base of one of which input signal is supplied; and a current source transistor for supplying current to said pair of differential transistors, and
    wherein any one of the linear amplifiers among said plurality of linear amplifiers is operated by controlling current supply to said current source transistor by level detecting signal of said comparator.

5. A logarithmic amplifier according to claim 1, further including a DC detecting circuit DC-detecting input AC signal,
    wherein output of the DC detecting circuit is supplied to said plurality of linear amplifiers and said comparator.

6. A logarithmic amplifier according to claim 5, wherein said DC detecting circuit includes a full wave rectifier full-wave-rectifying said input AC signal and a smoothing capacitor smoothing output of the full wave rectifier.

7. A logarithmic amplifier according to claim 5, wherein said level detecting signal is supplied to said plurality of linear amplifiers so as to switch the linear amplifiers step by step to output of smaller gain linear amplifier as input level becomes larger corresponding to level detecting signal output by said comparator.

8. A logarithmic amplifier according to claim 7, wherein said comparator includes: a differential amplifier having an input transistor to base of which input signal is supplied and plurality of reference transistors to base of which said plurality of different levels are supplied as reference level; and a level changeable means changing level supplied to bases of said reference transistors corresponding to comparing result between said input signal level and said reference level, and wherein current flows through any one of transistors among said input transistor and plurality of reference transistors corresponding to said input signal level, and current signal corresponding to the current becomes level detecting signal.

9. A logarithmic amplifier according to claim 8, wherein each of said plurality of linear amplifiers include: a pair of differential transistors to base of one of which input signal is supplied; and a current source transistor for supplying current to said pair of differential transistors, and where in any one of the linear amplifiers among said plurality of linear amplifiers is operated by controlling current supply to said current source transistor by level detecting signal of said comparator.

* * * * *

UNITED STATES PATENT AND TRADEMARK OFFICE
CERTIFICATE OF CORRECTION

PATENT NO. : 6,590,437 B2
DATED : July 8, 2003
INVENTOR(S) : Katsumi Imai

It is certified that error appears in the above-identified patent and that said Letters Patent is hereby corrected as shown below:

<u>Title page,</u>
Item [30], please add:
-- [30]  Foreign Application Priority Data
   February 1, 2001 (JP)   Japan……………... 2001-025155 --

Signed and Sealed this

Eighteenth Day of May, 2004

JON W. DUDAS
*Acting Director of the United States Patent and Trademark Office*